United States Patent
Hiramatsu et al.

(10) Patent No.: US 10,519,368 B2
(45) Date of Patent: *Dec. 31, 2019

(54) PHOSPHOR, MANUFACTURING METHOD THEREOF, AND LIGHT-EMITTING DEVICE USING THE PHOSPHOR

(71) Applicants: KABUSHIKI KAISHA TOSHIBA, Tokyo (JP); TOSHIBA MATERIALS CO., LTD., Yokohama-Shi (JP)

(72) Inventors: Ryosuke Hiramatsu, Yokohama (JP); Jun Tamura, Yokohama (JP); Kunio Ishida, Fuchu (JP); Keiko Albessard, Yokohama (JP); Masahiro Kato, Naka (JP)

(73) Assignees: Kabushiki Kaisha Toshiba, Minato-Ku (JP); Toshiba Materials Co., Ltd., Yokohama-Shi (JP)

( * ) Notice: Subject to any disclaimer, the term of this patent is extended or adjusted under 35 U.S.C. 154(b) by 49 days.

This patent is subject to a terminal disclaimer.

(21) Appl. No.: 15/175,627

(22) Filed: Jun. 7, 2016

(65) Prior Publication Data

US 2016/0340577 A1 Nov. 24, 2016

Related U.S. Application Data

(63) Continuation of application No. PCT/JP2014/082516, filed on Dec. 9, 2014.

(30) Foreign Application Priority Data

Dec. 9, 2013 (JP) .................................. 2013-254437

(51) Int. Cl.
*C09K 11/61* (2006.01)
*C09K 11/57* (2006.01)
(Continued)

(52) U.S. Cl.
CPC ............ *C09K 11/616* (2013.01); *C09K 11/57* (2013.01); *C09K 11/617* (2013.01);
(Continued)

(58) Field of Classification Search
CPC ..... C09K 11/617; C09K 11/57; H01L 33/502; H01L 33/504
See application file for complete search history.

(56) References Cited

U.S. PATENT DOCUMENTS 8,491,816 B2 * 7/2013 Hong .................... C09K 11/616
252/301.4 H
8,907,558 B2 12/2014 Hiramatsu et al.
(Continued)

FOREIGN PATENT DOCUMENTS

CN 103540314 A 1/2014
JP 2013-14715 1/2013
(Continued)

OTHER PUBLICATIONS

Arai, Yusuke, et al. "*Optical Transitions and Internal Vibronic Frequencies of $MnF_6^2$-Ions in $Cs_2SiF_6$ and $Cs_2GeF_6$ Red Phosphors*," Journal of the Electrochemical Society, vol. 158 (6) J179-J183 (2011).
(Continued)

*Primary Examiner* — C Melissa Koslow
(74) *Attorney, Agent, or Firm* — Burr & Brown, PLLC

(57) ABSTRACT

A red-light emitting phosphor is provided, having a basic composition represented by $K_a(Si_{1-x},Mn_x)F_b$ and also having a particular Raman spectrum, wherein the intensity ratio $I_1/I_0$, which is a ratio of ($I_1$) the peak in a Raman shift of 600±10 cm$^{-1}$ assigned to Mn—F bonds in the crystal to that ($I_0$) in a Raman shift of 650±10 cm$^{-1}$ assigned to Si—F bonds in the crystal, is 0.09 to 0.22. This phosphor is produced by bringing a silicon source in contact with an
(Continued)

aqueous reaction solution containing potassium permanganate and hydrogen fluoride, wherein a molar ratio of hydrogen fluoride to potassium permanganate is 87 to 127.

12 Claims, 4 Drawing Sheets

(51) Int. Cl.
  *H01L 33/50* (2010.01)
  *H01L 33/62* (2010.01)
(52) U.S. Cl.
  CPC ............ *H01L 33/504* (2013.01); *H01L 33/62* (2013.01); *H01L 33/502* (2013.01); *H01L 2224/48091* (2013.01); *H01L 2224/48247* (2013.01); *H01L 2224/48465* (2013.01); *H01L 2224/73265* (2013.01); *H01L 2924/181* (2013.01)

(56) References Cited

U.S. PATENT DOCUMENTS

| | | | |
|---|---|---|---|
| 9,422,471 | B2 | 8/2016 | Weiler et al. |
| 9,954,146 | B2 * | 4/2018 | Hiramatsu ............ C09K 11/617 |
| 2006/0169998 | A1 | 8/2006 | Radkov et al. |
| 2010/0142189 | A1 † | 6/2010 | Hong et al. |
| 2013/0082289 | A1 | 4/2013 | Sakuta et al. |
| 2013/0241396 | A1 | 9/2013 | Hiramatsu et al. |
| 2015/0380613 | A1 * | 12/2015 | Hiramatsu ............ C09K 11/617 257/98 |
| 2015/0380614 | A1 | 12/2015 | Hiramatsu et al. |

FOREIGN PATENT DOCUMENTS

| | | | |
|---|---|---|---|
| TW | 2009-46646 | * | 11/2009 |
| WO | 2009/099211 A1 | | 8/2009 |
| WO | 2009/119486 A1 | | 10/2009 |
| WO | WO 2009/119486 | † | 10/2009 |

OTHER PUBLICATIONS

Adachi, Sadao, et al. "*Direct Synthesis and properties of $K_2SiF_6:Mn^{4+}$ phosphor by wet chemical etching of Si wafer*," Journal of Applied Physics, vol. 104, 023512 (2008).
International Search Report and Written Opinion (PCT/JP2014/082516) dated Mar. 10, 2015.
Taiwanese Office Action (with English Translation (TW Application No. 103142609) dated Sep. 8, 2015.
KI4W International Preliminary Report on Patentability (PCT/JP2014/082516) dated Jun. 23, 2016.
Sadao Adachi and Toru Takahashi Direct synthesis and properties of K2SiF6:Mn4+ phosphor by wet chemical etching of Si wafer Journal of Applied Physics, Pub. Jul. 18, 2008, vol. 104, p. 023512.†

* cited by examiner
† cited by third party

PHOSPHOR, MANUFACTURING METHOD THEREOF, AND LIGHT-EMITTING DEVICE USING THE PHOSPHOR

CROSS REFERENCE TO RELATED APPLICATIONS

This application is a Continuation of International Application No. PCT/JP2014/082516, filed on Dec. 9, 2014, the entire contents of which is hereby incorporated by reference.

BACKGROUND OF THE INVENTION

1. Field of the Invention

The present disclosure relates to a phosphor, a method for manufacturing the phosphor, and a light-emitting device using the phosphor.

2. Description of Related Art

A light-emitting diode (LED) light-emitting device mainly comprises a combination of a phosphor and a LED chip serving as an excitation light source, and can realize various colors of emission light according to the combination.

Specifically, a white LED light-emitting device, which radiates white emission light, comprises a phosphor in combination with a LED chip that emits light in the blue region. For example, the device comprises a phosphor mixture and a LED chip giving off blue light. In practice, a phosphor emitting yellow light, which is complementary to blue light, is often adopted as the phosphor to produce a pseudo-white LED light-emitting device. Further, a three-wavelength white LED device is also developed which comprises a LED chip emitting blue light, a green- or yellow-light emitting phosphor and a red-light emitting phosphor. As an example of the red-light emitting phosphor used in that light-emitting device, $K_2SiF_6$:Mn phosphor is known.

DETAILED DESCRIPTION OF THE INVENTION

Figure 1:
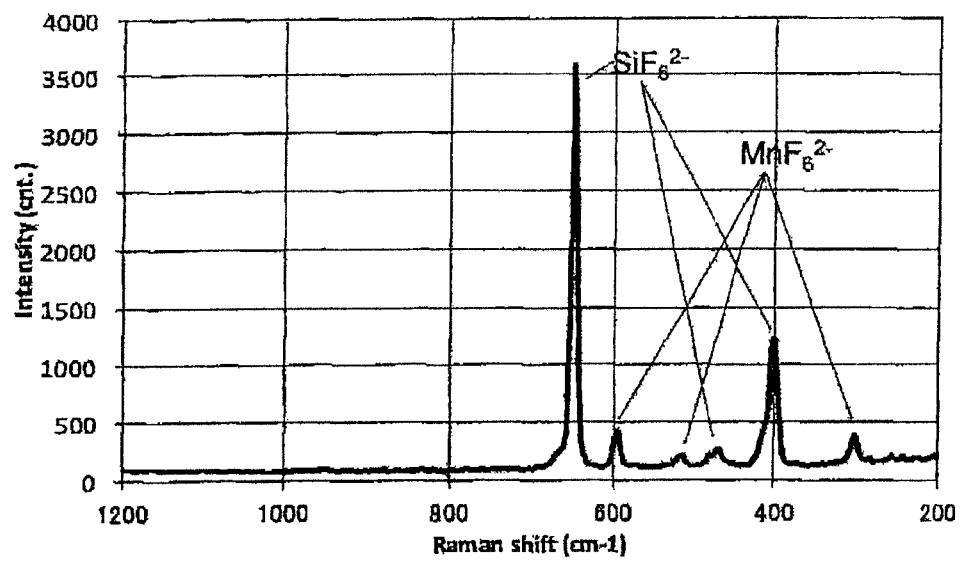
FIG. 1 shows a Raman spectrum of the phosphor according to the embodiment.

The following is a detailed description of embodiments of the present disclosure. However, it is noted that the embodiments described below are provided only to illustrate phosphors or light-emitting devices embodying the technical concept of the present disclosure, and hence the present disclosure is by no means limited to the following examples.

Further, this specification is not intended to restrict the members or components mentioned in the claims to the described embodiments. In particular, the sizes, materials, shapes, arrangement and the like of the components described in the embodiments are intended not to limit the scope of the present disclosure but to provide merely illustrative examples. Incidentally, the sizes and positional relationship of the members shown in the drawings may be exaggerated for the purpose of clarifying the explanation. The same names or same reference numbers in the drawings indicate the same or equivalent members or components, and hence detailed description thereof will be omitted. Some of the components constituting the present embodiments may be so integrated into one member that the member may function as the plural components, and on the contrary some members may share the function of one component.

The red-light emitting phosphor according to an embodiment of the present disclosure represented by the following formula (A):

(A)

in which a, b and x are numbers satisfying the conditions of 1.5≤a≤2.5, 5.5≤b≤6.5, and 0<x≤0.06, respectively;

and also has athe phosphor having Raman spectrum in which the an intensity ratio ($I_1/I_0$) of the peak intensity ($I_1$) in a Raman shift of 600±10 cm$^{-1}$ assigned to Mn—F bonds in the crystal to that ($I_0$) in a Raman shift of 650±10 cm$^{-1}$ assigned to Si—F bonds in the crystal is 0.09 to 0.22.

Further, the method according to another embodiment of the present disclosure for manufacturing a phosphor comprises:

preparing a reaction solution consisting of an aqueous solution containing potassium permanganate and hydrogen fluoride, and immersing a silicon source to react in said reaction solution;

wherein the molar ratio of hydrogen fluoride to potassium permanganate in said reaction solution is 87 to 127.

Furthermore, the light-emitting device according to still another embodiment of the present disclosure comprises a light-emitting element radiating light in the wavelength range of 440 to 470 nm, and a phosphor layer containing the above phosphor.

The applicant has intensively researched and studied phosphors mainly comprising potassium silicofluoride activated by manganese, and finally found by Raman spectroscopy that the luminous properties of those phosphors have correlations to the intensities of peaks assigned to bonds in their crystals. Specifically, it has been found that, if the intensity ratio of the peak assigned to Mn—F bonds to that assigned to Si—F bonds in a phosphor of potassium silicofluoride activated by manganese is in a particular range, the phosphor has excellent luminous properties.

The red-light emitting phosphor according to the embodiment mainly comprises potassium silicofluoride activated by manganese. Here, the "mainly comprises potassium silicofluoride" means that the phosphor has a basic crystal structure of potassium silicofluoride but that the elements constituting the crystal structure are partly replaced with other elements. The phosphor according to the embodiment has a basic composition represented by the following formula (A):

(A).

In the formula, a, b and x are numbers satisfying the conditions of:

1.5≤a≤2.5, preferably 1.8≤a≤2.2,
5.55≤b≤6.5, preferably 5.75≤b≤6.2, and
0<x≤0.06, preferably 0.01≤x≤0.05, respectively.

The phosphor of the embodiment contains manganese as the activator. If not containing manganese (namely, in the case of x=0), the phosphor cannot be observed to emit luminescence even when excited by light having an emission peak in the blue to UV region. Accordingly, x in the formula (A) must be larger than 0. Further, x is preferably 0.01 or more because the luminous efficacy tends to be improved according as the manganese content increases. In addition, the valence of manganese is preferably +4 so as to obtain a phosphor emitting red luminescence.

On the other hand, however, if the manganese content is too high, the emission intensity of the phosphor tends to be lowered because of concentration quenching. The manganese content (x) is hence generally 0.06 or less, preferably 0.05 or less to avoid the quenching.

The content of each element in the phosphor can be analyzed, for example, in the following method. For analyzing the metal elements such as K, Si and Mn, the synthesized phosphor is subjected to alkali fusion and then analyzed according to ICP emission spectroscopy by means of, for example, IRIS Advantage ICP spectrometer ([trademark], manufactured by Thermo Fisher Scientific Inc.). For analyzing the non-metal element F, the synthesized phosphor is subjected to thermal hydrolysis and then analyzed by means of, for example, DX-120 ion chromatograph system ([trademark], manufactured by Nippon Dionex K.K.). However, the element F can be analyzed by ion chromatography after the alkali fusion procedure is carried out in the same method as the above metal elements.

Although stoichiometrically containing no oxygen, the phosphor according to the embodiment is often inevitably contaminated with oxygen by decomposition of the surface during or after the synthesizing process thereof. The oxygen content in the phosphor is ideally equal to zero, but in practice preferably satisfies the condition of:

[oxygen content]/[(fluorine content)+(oxygen content)]<0.05 because the luminous efficacy is not seriously lowered under that condition.

Further, the phosphor of the embodiment may contain alkali metals, such as Na, Rb and Cs, and other elements, such as Ti, Ge and Sn, in small amounts. That is because the phosphor can show almost the same emission to achieve the desired effect even if containing those elements in small amounts. However, in view of stability of the phosphor and reactivity in the manufacturing process thereof, their contents are preferably small. In addition, if those elements are intended to be incorporated into the phosphor, it may be necessary to change the synthesizing procedures. Accordingly, it is preferred not to use metal elements other than the metals in the formula (A) so as to save the production cost.

The phosphor composition according the embodiment is represented by the formula (A), and it can be practically examined by melting or decomposing and then analyzing the phosphor. The applicant's study has revealed that the phosphor according to the embodiment contains two kinds of manganese, one of which is positioned in the inside of the phosphor and combined with fluorine to contribute toward the luminescence and the other of which is positioned in the surface or the like of the phosphor and combined with oxygen or the like to inhibit the luminescence. This means that, although the total content of Mn in the phosphor can be measured by ICP emission spectroscopy, it includes the amount of Mn inhibiting the luminescence. Here, the "surface" means not only the actual superficial face but also an area within a depth detectable by XPS analysis, and the "inside" means an area inner than that.

The manganese combined with fluorine can be detected by Raman spectroscopy, which is a technique for examining the specific molecular or crystal structure of the sample by use of scattered light emitted from the sample irradiated with light. Specifically, in the Raman spectroscopic measurement, the sample is exposed to light and then scattered light is measured. The scattered light include not only Rayleigh scattered light but also Raman scattered light, which has wavelengths different from the incident light according to various atomic bonds in the crystal structure. It is, therefore, possible by analyzing the scattered light to individually detect the peaks assigned to Si—F and Mn—F bonds in the sample phosphor.

For example, the Raman spectroscopic measurement can be carried out by LabRAM HR-PL unit ([trademark], manufactured by HORIBA Jobin Yvon Inc.) or the like. The measurement conditions may depend on the kind, particle shape and the like of the sample phosphor to be measured. Examples thereof are as follows:

method: backward-scattering Raman spectroscopic measurement,
slit width: 100 μm,
light source: semiconductor laser (785 nm),
optics: microscopic (object lens, 100 power magnification),
beam diameter: 1 μm,
light source power: 15 mW,
detector: CCD multi-channel,
cumulative time: 120 seconds,
cumulative number: 3 times, and
sample condition: at room temperature, in atmosphere.

As a result of the Raman spectroscopic measurement of the phosphor according to the embodiment, three peaks attributed to Si—F bonds ($SiF_6^{2-}$) and three peaks attributed to Mn—F bonds ($MnF_6^{2-}$) are observed. FIG. 1 shows a Raman spectrum of the phosphor according to the embodiment and also shows assignment of the peaks therein.

The applicant has found that the phosphor having a composition represented by the formula (A) shows high external and internal quantum efficiencies if it has a Raman spectrum in which the ratio ($I_1/I_0$) of the peak intensity ($I_1$) in a Raman shift of 600±10 $cm^{-1}$ assigned to Mn—F bonds to that ($I_0$) in a Raman shift of 650±10 $cm^{-1}$ assigned to Si—F bonds is 0.09 to 0.22. Specifically, the phosphor of the embodiment shows an internal quantum efficiency of 80% or more.

According to Non-patent document 1, the peaks in Raman shifts of 650±10 $cm^{-1}$ and 600±10 $cm^{-1}$ are assigned to A1g mode, namely, stretching vibration of Si—F and Mn—F bonds, respectively. Since those peaks are both attributed to the same vibration mode, the abundance ratio between Si—F and Mn—F bonds corresponds to the peak intensity ratio. It, therefore, can be said that, the larger the intensity ratio is, the more Mn atoms are combined with F atoms. Hereinafter, this peak intensity ratio is referred to as $R_{A1g}$.

According to Non-patent document 1, the peaks in Raman shifts of 480±10 $cm^{-1}$ and 520±10 $cm^{-1}$ attributed to Si—F and Mn—F bonds, respectively, are both assigned to Eg mode while those in Raman shifts of 410±10 $cm^{-1}$ and 310±10 $cm^{-1}$ attributed to Si—F and Mn—F bonds, respectively, are both assigned to F2g (T2g) mode. The intensity ratios $R_{Eg}$ and $R_{F2g}$ of those peaks assigned to Eg and F2g (T2g), respectively, were also evaluated to find that, if they are in the ranges of 0.75 to 1.5 and 0.31 to 0.61, respectively, the phosphor tends to have high external and inner quantum efficiencies. If the peak intensities assigned to Mn—F bonds are 0, the phosphor is presumed not to contain Mn—F bonds and hence the activation effect by Mn cannot be obtained, so that it is impossible to observe luminescence of the phosphor.

As described above, the total content of Mn in the phosphor having a composition represented by the formula (A) can be quantitatively determined by ICP emission spectroscopy. However, phosphors of potassium silicofluoride obtained by a normal synthesis method often contain Mn combined with oxygen, namely, $MnO_x$ in the surface or the like, and hence it is difficult to selectively detect only the luminescence-supporting Mn by ICP emission spectroscopy. In contrast, although Raman spectroscopy cannot quantitatively determine the amount of Mn, it can detect Mn—F bonds, which directly contribute toward the luminescence, in terms of the intensity ratio to the peak of Si—F bonds.

The "external quantum efficiency ($\eta$)" here means a product value of the following absorptivity ($\alpha$) and internal quantum efficiency ($\eta'$):

$$\text{absorptivity } (\alpha) = \frac{\int \lambda \cdot [E(\lambda) - R(\lambda)] d\lambda}{\int \lambda \cdot [E(\lambda)] d\lambda} \quad (I)$$

$$\text{internal quantum efficiency } (\eta') = \frac{\int \lambda \cdot [P(\lambda)] d\lambda}{\int \lambda \cdot [E(\lambda) - R(\lambda)] d\lambda} \quad (II)$$

$$\text{external quantum efficiency } (\eta) = \frac{\int \lambda \cdot [P(\lambda)] d\lambda}{\int \lambda \cdot [E(\lambda)] d\lambda} \quad (III)$$

In the formulas, $E(\lambda)$: the whole spectrum of light emitted by the excitation light source onto the phosphor (in terms of the number of photons), $R(\lambda)$: the spectrum of light emitted by the excitation light source but reflected by the phosphor (in terms of the number of photons), and $P(\lambda)$: the emission spectrum of the phosphor (in terms of the number of photons).

As shown above, the external quantum efficiency can be obtained by (I)×(II).

The external quantum efficiency, internal quantum efficiency and absorptivity can be measured, for example, by means of C9920-02G absolute PL quantum yields measurement system ([trademark], manufactured by Hamamatsu Photonics K.K.). Those luminous characteristics can be measured by using blue light having a peak wavelength in about 440 to 460 nm with a half-width of 5 to 15 nm as the excitation light.

Figure 2:
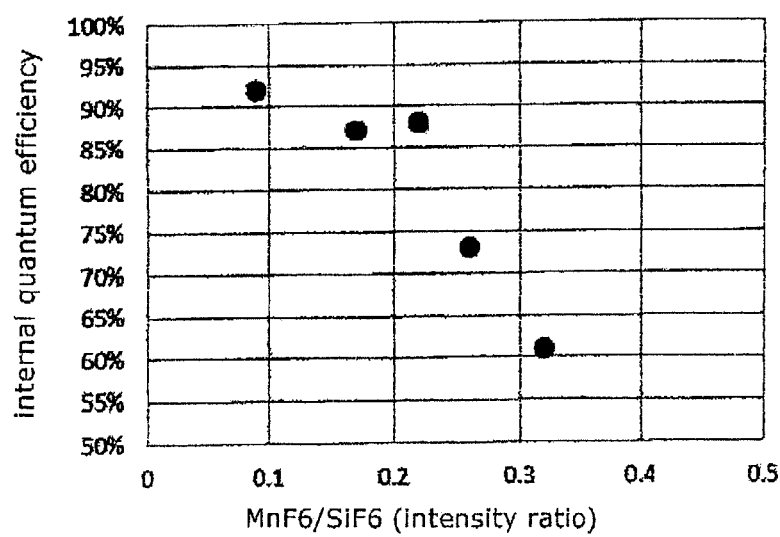
FIG. 2 shows a relation between the internal quantum efficiency and the intensity ratio of the peak assigned to Mn—F bonds to that assigned to Si—F bonds according to Raman spectroscopic measurement.
Figure 3:
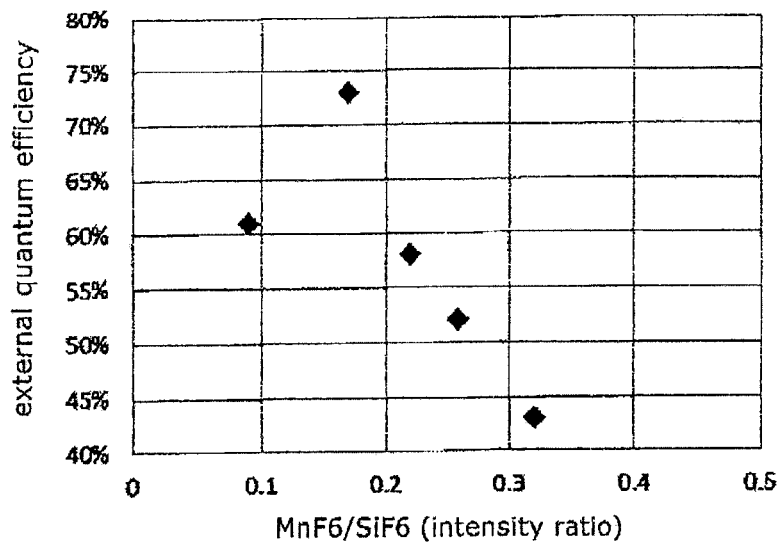
FIG. 3 shows a relation between the external quantum efficiency and the intensity ratio of the peak assigned to Mn—F bonds to that assigned to Si—F bonds according to Raman spectroscopic measurement.

FIGS. 2 and 3 show relations between the internal quantum efficiency and $R_{A1g}$ obtained from the Raman spectrum and between the external quantum efficiency and $R_{A1g}$, respectively (described later in detail). They indicate that both the internal and external quantum efficiencies are favorable under the condition that the $R_{A1g}$ value is in the range of 0.09 to 0.22.

The phosphor according to the embodiment can be manufactured in any method. Specifically, for example, it can be produced in the following method.

First, an aqueous solution containing potassium permanganate ($KMnO_4$) and hydrogen fluoride (HF) is prepared as a reaction solution. The solution is then brought into contact with a silicon source, so that the reaction proceeds on the surface of the silicon source to form the phosphor. In the reaction solution, the molar ratio of hydrogen fluoride to potassium permanganate (hereinafter often referred to as "$r_{H/K}$") is 87 to 127, preferably not less than 90 and/or not more than 120. The [HF] concentration in the reaction solution is preferably 27 to 40 wt %, more preferably 28 to 35 wt %. If the ratio of hydrogen fluoride to potassium permanganate and the concentration of hydrogen fluoride are in the above ranges in the reaction solution, it is possible to obtain a phosphor having high internal quantum efficiency.

It is not fully clear why the phosphor having high internal quantum efficiency can be obtained if the $r_{H/K}$, which is a ratio of hydrogen fluoride to potassium permanganate, and the HF concentration are in the above ranges. However, the reason is now presumed to be as follows.

The phosphor according to the embodiment has a crystal structure in which Si in the $K_aSiF_b$ matrix is partly substituted with Mn. In the synthesis process comprising the step of immersing a silicon source in the reaction solution containing potassium permanganate and hydrogen fluoride, the silicon source is oxidized by potassium permanganate and converted into silica and then the silica is fluorinated by HF and further undergoes an ion-exchange reaction to form the $K_aSiF_b$ matrix. On the other hand, after oxidizing the silicon source, Mn in the potassium permanganate is changed to be quadrivalent and captured in the $K_aSiF_b$ matrix. In this process, the reaction of generating $K_aSiF_b$ from silica proceeds very fast while that of generating quadrivalent Mn proceeds more slowly than the generation speed of $K_aSiF_b$.

The generation speed of $K_aSiF_b$ depends on the [H$^+$] and [K$^+$] concentrations. Specifically, if the HF concentration is high, dissolution of silica is promoted and accordingly the generation speed of $K_aSiF_b$ is accelerated. However, since the speed of Mn valence changing is not accelerated, the amount of Mn captured in the $K_aSiF_b$ matrix is decreased if the HF concentration is too high. This is thought to be the reason why the ratio of Mn—F bonds to Si—F bonds is decreased in the resultant phosphor. In contrast, if the concentration of $KMnO_4$ is too high, Mn—F bonds are so increased that Mn atoms may interact with each other to lower the efficiency by concentration quenching. Accordingly, in the reaction solution, the ratio of hydrogen fluoride to potassium permanganate and the concentration of hydrogen fluoride are necessarily in the above particular ranges.

If the reaction solution contains hydrogen fluoride in a high concentration, generation of $K_aSiF_b$ is promoted. That is preferred. However, if the HF concentration is too high, the relative concentration of [K$^+$] is decreased and hence the ion-exchange reaction does not proceed smoothly, and consequently the yield of the phosphor is thought be remarkably lowered.

The phosphor particles thus manufactured may be subjected to coating treatment to form a surface layer on the surface thereof so as to, for example, protect the phosphor from moisture or to improve coatability in producing the device. Material of the surface layer is, for example, at least one selected from silicone resin, epoxy resin, fluororesin, tetraethoxysilane (TEOS), silica, zinc silicate, aluminum silicate, calcium polyphosphate, silicone oil or silicon grease. The zinc silicate and aluminum silicate are represented by, for example, $ZnO \cdot cSiO_2$ ($1 \leq c \leq 4$) and $Al_2O_3 \cdot dSiO_2$ ($1 \leq d \leq 10$), respectively. The surface of the phosphor particles does not need to be completely coated with the surface layer, and may be partly bared. As long as provided on a part of the phosphor surface, the surface layer of the above material can work effectively even if the whole surface is not completely covered. The surface layer can be provided by immersing the phosphor particles in a dispersion or solution of the material and then drying them by heating or the like. In order to obtain the effect of the surface layer without damaging the essential function of the phosphor, the amount of the surface layer is preferably 0.1 to 5 vol % based on the phosphor particles.

The phosphor particles of the embodiment may be classified with a sieve according to the coating method adopted for producing the light-emitting device. For producing a common white LED device, which adopts excitation light having an emission peak in the blue region, it is generally preferred to use the phosphor particles sieved to have a mean particle size of 1 to 50 µm. If the phosphor particles are sieved to be too small, the emission intensity may be lowered. On the other hand, if sieved to be too large, they may clog a nozzle of coating machine when the phosphor layer is formed in the LED device, so that the operational efficiency and production yield may be lowered and/or so that the resultant light-emitting device may exhibit light of uneven color.

The phosphor according to the embodiment of the present disclosure can be combined with a light-emitting element having an emission peak in the blue region, to obtain a LED light-emitting device of the embodiment. The LED light-emitting device according to the embodiment exhibits larger emission intensity than conventional devices employing $K_2SiF_6$:Mn red-light emitting phosphors.

The phosphor of the embodiment can be excited by an excitation light source showing an emission peak in the blue to UV region. When the phosphor is used in the light-emitting device, the excitation light source is preferably a light-emitting element having an emission peak in the wavelength range of 440 to 470 nm. In view of the luminous efficacy, it is not preferred to use light-emitting elements having emission peaks out of the above range. Examples of the light-emitting element include solid-state light source elements such as LED chips and laser diodes.

The phosphor of the embodiment emits red luminescence, and therefore can be combined with green- and yellow-light emitting phosphors to obtain a white light-emitting device. What phosphors to use can be freely selected according to the purpose of the light-emitting device. For example, in the case of producing a white light-emitting device having a low color temperature, the phosphor of the embodiment is combined with a yellow-light emitting phosphor to obtain a device excellent in both efficacy and color rendering properties.

Green- and yellow-light emitting phosphors can be said to be phosphors having main emission peaks in the wavelength range of 520 to 570 nm. Examples of those phosphors include: silicate phosphors, such as, $(Sr,Ca,Ba)_2SiO_4$:Eu and $Ca_3(Sc,Mg)_2Si_3O_{12}$:Ce; $(Y,Gd)_3(Al,Ga)_5O_{12}$:Ce; sulfide phosphors, such as, $(Ca,Sr,Ba)Ga_2S_4$:Eu; and alkaline earth oxynitride phosphors, such as, $(Ca,Sr,Ba)Si_2O_2N_2$:Eu and $(Ca,Sr)$-αSiAlON. Here, the "main emission peaks" means the wavelengths at which the phosphors exhibit the largest emission intensities in their emission spectra. The emission peaks of the exemplified phosphors have been already reported in various references and the like. The emission peaks are often shifted within about 10 nm by small amounts of additive elements used in producing the phosphors or by slight fluctuation of the composition, but even the phosphors showing those shifted emission peaks are also included in the above exemplified phosphors.

According to the purpose, the light-emitting device employing the phosphor of the embodiment may further comprise blue green-, orange- and/or red-light emitting phosphors other than the above.

Examples of the orange- and red-light emitting phosphors include: silicate phosphors, such as, $(Sr,Ca,Ba)_2SiO_4$:Eu; tungstate phosphors, such as, $Li(Eu,Sm)W_2O_8$; oxysulfide phosphors, such as, $(La,Gd,Y)_2O_2S$:Eu; sulfide phosphors, such as, $(Ca,Sr,Ba)S$:Eu; and nitride phosphors, such as, $(Sr,Ba,Ca)_2Si_5N_8$:Eu and $(Sr,Ca)AlSiN_3$:Eu. Those can be employed in combination with the phosphor of the embodiment so as to manage not only the efficacy but also the color rendering properties for illumination use and the color gamut for backlight use. However, if too many phosphors are used, the light-emitting device may be impaired in the efficacy because of re-absorption phenomenon, in which one of the phosphors absorbs light emitted from another thereof, and/or because of scattering phenomenon, in which light emitted from one of the phosphors is scattered by others thereof.

Figure 4:
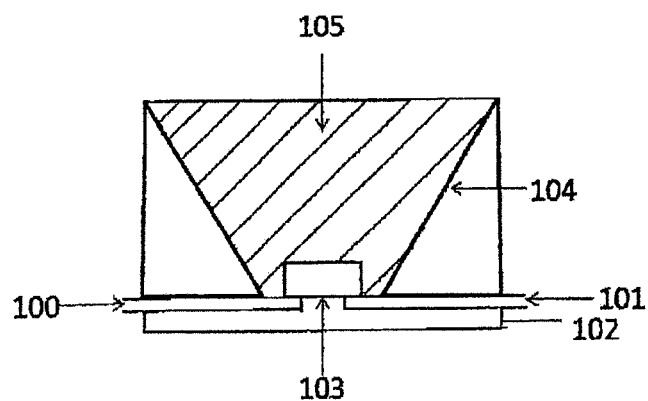
FIG. 4 shows a schematic sectional view of a light-emitting device according to an embodiment of the disclosure.

FIG. 4 shows a schematic sectional view of a light-emitting device according to one embodiment of the present disclosure.

The shown device comprises leads 100 and 101, a stem 102, a semiconductor light-emitting element 103, a reflective surface 104, and a phosphor layer 105. The light-emitting element 103 is mounted with Ag paste or the like at the center of the bottom, and radiates, for example, UV or visible emission. Examples of the light-emitting element 103 include GaAs type and GaN type semi-conductor light-emitting diodes. The positions of the leads 100 and 101 can be adequately modified.

The phosphor layer 105 is placed in the concavity of the device. It can be formed by dispersing the phosphor of the embodiment in a resin layer made of, for example, silicone resin in an amount of 5 to 50 wt %. The phosphor can be fixed with various binders, such as, organic resin materials and inorganic glass materials.

The organic binder materials are preferably highly light-resistant transparent resins, such as, epoxy resin and acrylic resin as well as the silicone resin described above. The inorganic binder materials are preferably, for example, low melting point glass or the like made with alkaline earth borate; silica or alumina in the form of such fine particles that large particles of the phosphor can be fixed; and alkaline earth phosphate or the like obtained by sedimentation. Those binders can be used singly or in combination with two or more. Further, the phosphors used in the phosphor layer may be subjected to surface-coating treatment, if necessary. The surface coating prevents the phosphors from deterioration caused by external factors, such as, heat, humidity and UV. In addition, the treatment makes it possible to manage the dispersability of the phosphors so that the phosphor layer can be easily designed.

The semiconductor light-emitting element 103 may be of a flip chip type in which the n- and p-electrodes are placed on the same plane. This element can avoid troubles concerning the wires, such as disconnection or dislocation of the wires and light-absorption by the wires. In that case, therefore, it is possible to obtain a semiconductor light-emitting device excellent both in reliability and in luminance. Further, it is also possible to adopt a light-emitting element 103 having an n-type substrate so as to produce a light-emitting device constituted as described below. In that device, an n-electrode is formed on the back surface of the n-type substrate while a p-electrode is formed on the top surface of a semiconductor layer laid on the substrate. The n- or p-electrode is mounted on one of the leads, and the p- or n-electrode is connected to the other lead by way of a wire, respectively. The size and kind of the light-emitting element 103 and the dimension and shape of the concavity can be properly changed.

Figure 5:
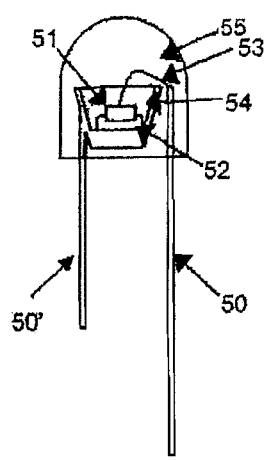
FIG. 5 shows a schematic sectional view of a light-emitting device according to another embodiment of the disclosure.

FIG. 5 shows a schematic sectional view of a shell-type light-emitting device, in which a semi-conductor light-emitting element 51 is mounted on a lead 50' with a mount member 52 and covered with a predip material 54. The light-emitting element 51 is connected to a lead 50 by way of a wire 53, and is sealed with a casting material 55. The phosphor of the embodiment is contained in the predip material 54. The light-emitting device, such as a white LED device, according the embodiment is suitably used for general illumination as described above, but is also favorably used in combination with filters such as color filters to serve as a lighting element such as a light source for backlighting of liquid crystal displays. Specifically, it can be adopted as a LED backlight light source or as a red-light emitting element employed in an inorganic electroluminescence device comprising a blue-light emitting layer.

The embodiments of the present disclosure will be further explained in detail by Examples and Comparative examples described below, but are by no means limited to the following Examples unless deviating from the scope and spirit of the disclosure.

EXAMPLES

Examples 1 to 3

As a starting material, a commercially available Si single crystal was prepared. Independently, 10.8 g of $KMnO_4$ powder, 250 ml of an aqueous solution of HF (49%) and 150 ml of pure water were sufficiently mixed to prepare a reaction solution, in which the molar ratio of HF to $KMnO_4$ and the [HF] concentration were 103 and 31.5 wt %, respectively. In the reaction solution, the Si single crystal was made to react at room temperature (20° C.) for 40 minutes while the reaction solution was stirred slowly enough to be homogeneous. As a result, a phosphor was formed on the surface of the Si single crystal. When the phosphor particles grew to be large, they spontaneously separated from the Si single crystal surface and deposited on the bottom of the vessel.

The obtained phosphor was subjected Raman spectroscopic measurement to calculate $R_{A1g}$. Further, the internal and external quantum efficiencies were measured by means of C9920-02G absolute PL quantum yields measurement system ([trademark], manufactured by Hamamatsu Photonics K.K.).

The above procedure was repeated except for changing the mixing ratio of the materials, to produce phosphors of Examples 2 and 3 and Comparative examples 1 and 2. The $R_{A1g}$, internal and external quantum efficiencies thereof were also measured in the same method as described above. The results are shown in Table 1 and FIGS. 2 and 3.

TABLE 1

| | Reaction solution | | Phosphor composition | | | Internal quantum | External quantum | | |
|---|---|---|---|---|---|---|---|---|---|
| | $r_{H/K}$ | [HF] concentration (wt %) | a | b | x | efficiency | efficiency | $R_{A1g}$ | absorptivity |
| Ex. 1 | 124 | 37% | 1.9 | 6.1 | 0.02 | 92% | 61% | 0.09 | 66.3% |
| Ex. 2 | 91 | 28% | 2.0 | 6.0 | 0.04 | 87% | 73% | 0.17 | 83.9% |
| Ex. 3 | 103 | 31% | 2.2 | 6.2 | 0.03 | 88% | 58% | 0.22 | 65.9% |
| Com. 1 | 83 | 26% | 2.2 | 6.2 | 0.04 | 73% | 52% | 0.26 | 71.2% |
| Com. 2 | 62 | 20% | 1.9 | 6.1 | 0.06 | 61% | 43% | 0.32 | 70.5% |

Examples 4, 5 and Comparative Examples 3 to 7

Figure 6:
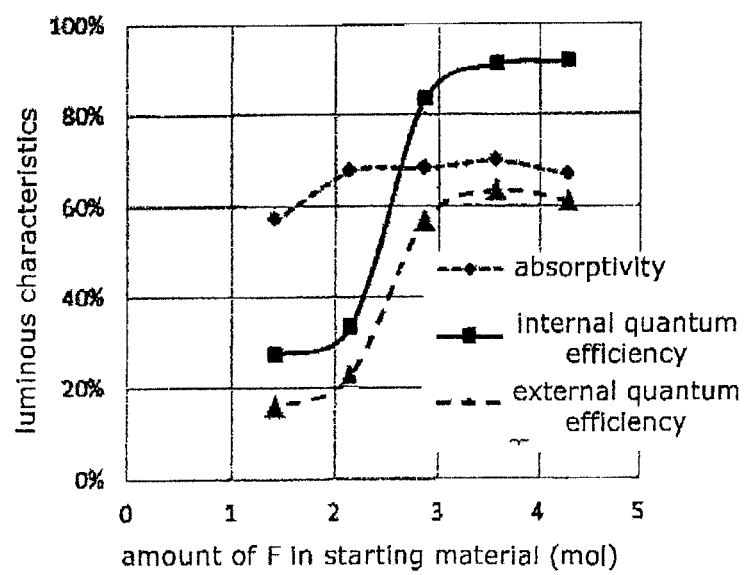
FIG. 6 shows changes of the absorptivity, internal and external quantum efficiencies in relation to [HF] concentration in the reaction solution.
Figure 7:
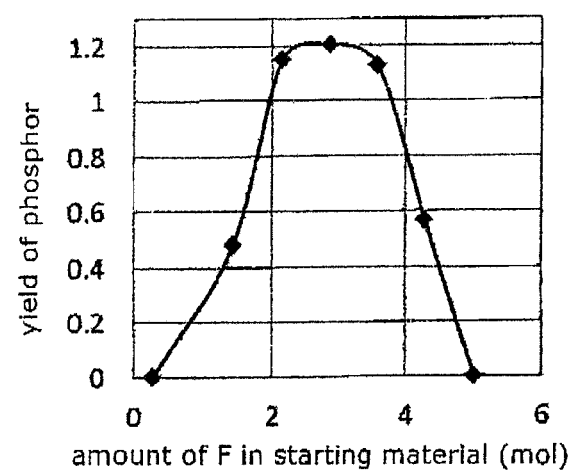
FIG. 7 shows a relation between the yield of the phosphor and [HF] concentration in the reaction solution.

The procedure of Example 1 was repeated except for changing the mixing ratio of $KMnO_4$ powder and HF aqueous solution, to produce reaction solutions shown in Table 2. From the prepared reaction solutions, phosphors shown in Table 2 were synthesized in the same method as Example 1. The internal and external quantum efficiencies thereof and the yields of the obtained phosphors are also shown in Table 2. Further, FIG. 6 shows changes of the absorptivity, internal and external quantum efficiencies in relation to [HF] concentration, and FIG. 7 shows a relation between the yield of the phosphor and [HF] concentration.

TABLE 2

| | Reaction solution | | Phosphor composition | | | Luminous characteristics | | | |
|---|---|---|---|---|---|---|---|---|---|
| | $r_{H/K}$ | [HF] concentration (wt %) | a | b | x | Yield of phosphor | Absorptivity | Internal quantum efficiency | External quantum efficiency |
| Com. 3 | 145 | 43% | — | — | — | 0.00 | — | — | — |
| Ex. 4 | 124 | 37% | 2.1 | 6.1 | 0.02 | 0.57 | 66% | 92% | 61% |
| Ex. 5 | 103 | 31% | 2.0 | 6.1 | 0.02 | 1.13 | 70% | 91% | 63% |
| Ex. 6 | 91 | 28% | 1.9 | 6.0 | 0.04 | 1.20 | 69% | 85% | 59% |
| Com. 5 | 62 | 20% | 2.0 | 6.0 | 0.03 | 1.15 | 67% | 33% | 22% |
| Com. 6 | 41 | 13% | 1.9 | 5.9 | 0.03 | 0.48 | 57% | 27% | 15% |

DESCRIPTION OF THE NUMERALS

100: lead, 101: lead, 102: stem,
103: semiconductor light-emitting element,
104: reflective surface,
105: phosphor layer
50, 50': lead,
51: semi-conductor light-emitting element,
52: mount member, 53: bonding wire,
54: predip material, 55: casting material

The invention claimed is:
1. A phosphor represented by the following formula (I):

$K_a(Si_{1-x},Mn_x)F_b$;

wherein a, b and x are numbers satisfying the conditions of 1.5≤a≤2.5, 5.5≤b≤6.5, and 0<x≤0.06 respectively;
wherein the phosphor has a Raman spectrum in which an intensity ratio ($I_1/I_0$), which is a ratio of the peak intensity ($I_1$) in a Raman shift of 600±10 cm$^{-1}$ assigned to Mn—F bonds in the crystal to that ($I_0$) in a Raman shift of 650±10 cm$^{-1}$ assigned to Si—F bonds in the crystal, is 0.09 to 0.17;
wherein the phosphor has an absorptivity (α) in a range of 66% to 83.9%; and
wherein the absorptivity (α) is equal to an external quantum efficiency (η) of the phosphor/an internal quantum efficiency (η') of the phosphor, wherein the internal quantum efficiency (η') of the phosphor is represented by formula (II) below, and wherein the external quantum efficiency (η) of the phosphor is represented by formula (III) below, $$\text{internal quantum efficiency}(\eta') = \frac{\int \lambda \cdot [P(\lambda)]d\lambda}{\int \lambda \cdot [E(\lambda) - R(\lambda)]d\lambda} \quad (II)$$

$$\text{external quantum efficiency}(\eta) = \frac{\int \lambda \cdot [P(\lambda)]d\lambda}{\int \lambda \cdot [E(\lambda)]d\lambda} \quad (III)$$

wherein E(λ) represents a whole spectrum of light emitted by an excitation light source onto the phosphor in terms of the number of photons,
wherein R(λ) represents a spectrum of light emitted by the excitation light source but reflected by the phosphor in terms of the number of photons, and
wherein P(λ) represents an emission spectrum of the phosphor in terms of the number of photons.

2. The phosphor according to claim 1, having an internal quantum efficiency of 80% or more.

3. The phosphor according to claim 1, wherein the external quantum efficiency is in a range of 61% to 73%.

4. The phosphor according to claim 1, wherein the internal quantum efficiency of the phosphor is 85% or more.

5. The phosphor according to claim 1, wherein the internal quantum efficiency of the phosphor is in a range of 85% to 92%.

6. A method of manufacturing a phosphor, comprising:
immersing a silicon source to react in an aqueous reaction solution containing potassium permanganate and hydrogen fluoride;
wherein a molar ratio of hydrogen fluoride to potassium permanganate in the aqueous reaction solution is 87 to 127; and
wherein a concentration of hydrogen fluoride in the aqueous reaction solution is in a range of 27 to 40 wt %.

7. A light-emitting device comprising:
a light-emitting element radiating light in the wavelength range of 440 to 470 nm; and
a phosphor layer containing the phosphor according to claim 1.

8. The light-emitting device according to claim 7, wherein the luminescent layer contains a phosphor having a main emission peak in a wavelength range of 520 to 570 nm.

9. The light-emitting device according to claim 7, wherein the phosphor layer further contains a green-light emitting phosphor or a yellow-light emitting phosphor.

10. The light-emitting device according to claim 9, wherein the green-light emitting phosphor or the yellow-light emitting phosphor is selected from the group consisting of $(Sr,Ca,Ba)_2SiO_4$:Eu, $Ca_3(Sc,Mg)_2Si_3O_{12}$:Ce, $(Y,Gd)_3(Al,Ga)_5O_{12}$:Ce, $(Ca,Sr,Ba)Ga_2S_4$:Eu, $(Ca,Sr,Ba)Si_2O_2N_2$:Eu, and (Ca,Sr)-αSiAlON.

11. The light-emitting device according to claim 7, wherein the phosphor layer further contains an orange-light emitting phosphor or a red-light emitting phosphor.

12. The light-emitting device according to claim 11, wherein the orange-light emitting phosphor or the red-light emitting phosphor is selected from the group consisting of $(Sr,Ca,Ba)_2SiO_4$:Eu, $Li(Eu,Sm)W_2O_8$, $(La,Gd,Y)_2O_2S$:Eu, $(Ca,Sr,Ba)S$:Eu, $(Sr,Ba,Ca)_2Si_5N_8$:Eu, and $(Sr,Ca)AlSiN_3$:Eu.

* * * * *